(12) United States Patent
Kitamura et al.

(10) Patent No.: US 12,205,887 B2
(45) Date of Patent: *Jan. 21, 2025

(54) SEMICONDUCTOR DEVICE AND METHOD FOR MANUFACTURING THE SEMICONDUCTOR DEVICE PRELIMINARY CLASS

(71) Applicant: Kioxia Corporation, Tokyo (JP)

(72) Inventors: Masayuki Kitamura, Yokkaichi Mie (JP); Atsushi Kato, Yokkaichi Mie (JP); Hiroaki Matsuda, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/300,700

(22) Filed: Apr. 14, 2023

(65) Prior Publication Data

US 2023/0253311 A1    Aug. 10, 2023

Related U.S. Application Data

(63) Continuation of application No. 17/183,617, filed on Feb. 24, 2021, now Pat. No. 11,658,110.

(30) Foreign Application Priority Data

Feb. 25, 2020 (JP) ................................. 2020-029695

(51) Int. Cl.
*H01L 23/522* (2006.01)
*H01L 21/285* (2006.01)
(Continued)

(52) U.S. Cl.
CPC .... *H01L 23/5226* (2013.01); *H01L 21/28556* (2013.01); *H01L 21/28568* (2013.01); *H01L 21/76843* (2013.01); *H01L 23/53238* (2013.01)

(58) Field of Classification Search
CPC .......... H01L 23/5226; H01L 21/28556; H01L 21/28568; H01L 21/76843;
(Continued)

(56) References Cited

U.S. PATENT DOCUMENTS 5,296,404 A    3/1994   Akahori et al.
5,789,321 A    8/1998   Ohshita
(Continued)

FOREIGN PATENT DOCUMENTS

JP    H11-074354 A    3/1999
JP    2000-174230 A   6/2000
(Continued)

*Primary Examiner* — Karen Kusumakar
(74) *Attorney, Agent, or Firm* — Foley & Lardner LLP

(57) ABSTRACT

A semiconductor device includes an interconnect including (i) a first layer, and (ii) a second layer provided on the first layer and including copper. The device also includes a plug provided on the interconnect and including (a) a third layer including titanium and nitrogen, and (b) a fourth layer provided on the third layer and including tungsten. A concentration of chlorine in the third layer is less than or equal to $5.0 \times 10^{21}$ atoms/cm$^3$, and a concentration of oxygen at the interface between the third layer and the fourth layer is less than or equal to $5.0 \times 10^{21}$ atoms/cm$^3$.

17 Claims, 11 Drawing Sheets

(51) Int. Cl.
*H01L 21/768* (2006.01)
*H01L 23/532* (2006.01)

(58) Field of Classification Search
CPC ..... H01L 23/53238; H01L 2224/08145; H01L 2224/80895; H01L 2224/80896; H01L 24/00; H01L 25/18; H01L 21/76856; H01L 24/08; H01L 23/53266; H01L 21/76841
See application file for complete search history.

(56) References Cited

U.S. PATENT DOCUMENTS

| | | | |
|---|---|---|---|
| 2005/0250321 A1 | 11/2005 | Hwang | |
| 2005/0263890 A1* | 12/2005 | Han | H01L 21/28556 257/E21.585 |
| 2008/0176396 A1 | 7/2008 | Futase et al. | |
| 2010/0022086 A1 | 1/2010 | Choi et al. | |
| 2016/0379879 A1 | 12/2016 | Hotta et al. | |
| 2017/0062705 A1* | 3/2017 | Yamakawa | H10B 61/22 |
| 2018/0251898 A1 | 9/2018 | Yamaguchi et al. | |
| 2021/0193828 A1 | 6/2021 | Cheng et al. | |

FOREIGN PATENT DOCUMENTS

| | | |
|---|---|---|
| JP | 2005-197684 A | 7/2005 |
| JP | 2005-223059 A | 8/2005 |
| WO | WO-2011/055671 A1 | 5/2011 |

* cited by examiner

SEMICONDUCTOR DEVICE AND METHOD FOR MANUFACTURING THE SEMICONDUCTOR DEVICE PRELIMINARY CLASS

CROSS-REFERENCE TO RELATED APPLICATION

This application is a Continuation of U.S. patent application Ser. No. 17/183,617, filed Feb. 24, 2021, which is based upon and claims the benefit of priority from Japanese Patent Application No. 2020-029695, filed Feb. 25, 2020, the entire contents of which are incorporated herein by reference.

FIELD

Embodiments described herein relate generally to a semiconductor device and a method for manufacturing the semiconductor device.

BACKGROUND

When a via plug is disposed on a metal interconnect, the metal interconnect sometimes deteriorates due to the influence of the via plug. Such a deterioration in the metal interconnect needs to be prevented.

DETAILED DESCRIPTION

Embodiments provide a semiconductor device which can prevent a deterioration in an interconnect due to the influence of a plug, and a method for manufacturing the semiconductor device.

In general, according to one embodiment, a semiconductor device may include an interconnect including a first layer, and a second layer provided on the first layer and including copper. The device may also include a plug provided on the interconnect and including a third layer including titanium and nitrogen, and a fourth layer provided on the third layer and including tungsten. In some embodiments, the chlorine concentration in the third layer is not more than $5.0 \times 10^{21}$ atoms/cm$^3$ (or is less than or equal to $5.0 \times 10^{21}$ atoms/cm$^3$), and the oxygen concentration at the interface between the third layer and the fourth layer is not more than $5.0 \times 10^{21}$ atoms/cm$^3$ (or is less than or equal to $5.0 \times 10^{21}$ atoms/cm$^3$).

Hereinafter, embodiments of the present disclosure will be described with reference to the drawings. In FIG. 1 through FIG. 11, the same symbols are used for the same or similar components or elements, and a duplicate description thereof is omitted.

First Embodiment

Figure 1A:
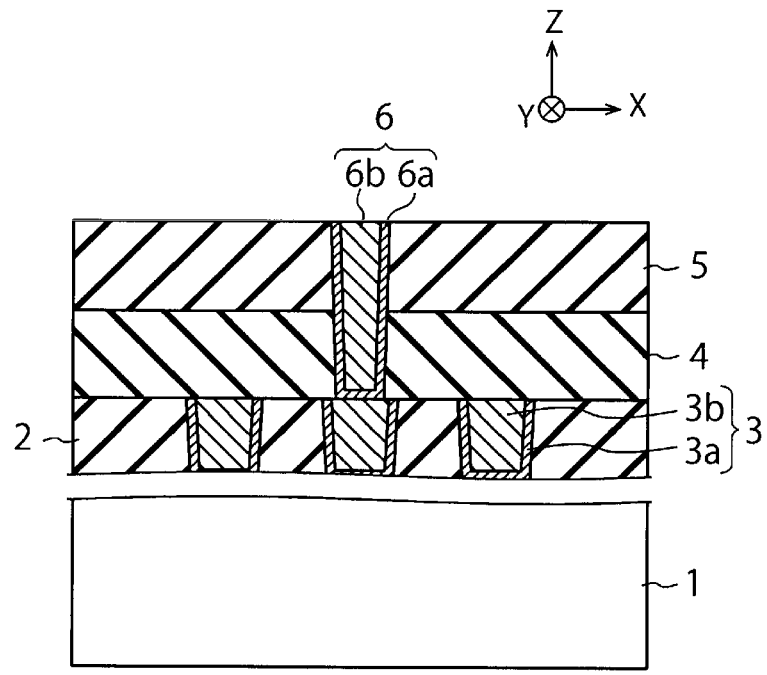
FIG. 1A and FIG. 1B are cross-sectional views showing the structure of a semiconductor device according to a first embodiment.
Figure 1B:
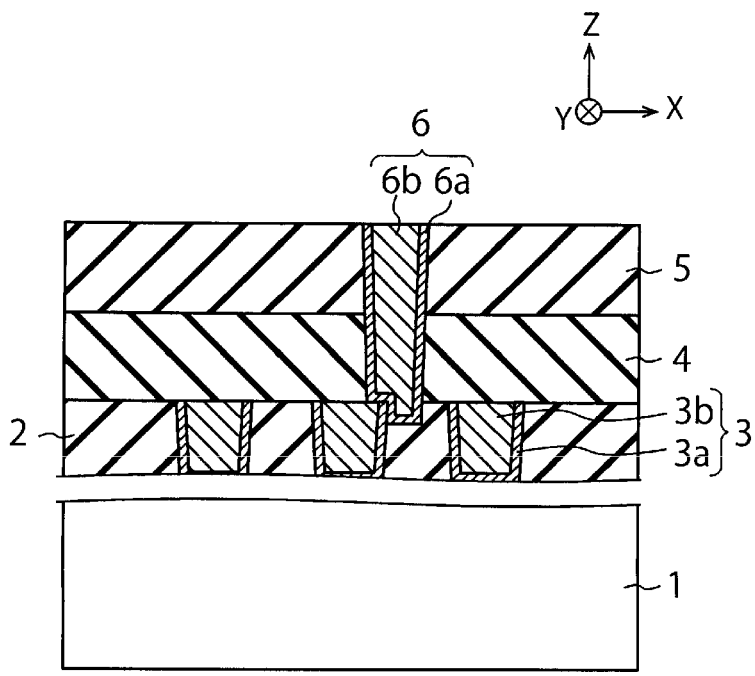

FIG. 1A and FIG. 1B are cross-sectional views showing the structure of a semiconductor device according to a first embodiment.

As shown in FIG. 1A or 1B, the semiconductor device of this embodiment may include a substrate 1, an interlayer insulating film 2, a plurality of interconnects 3, an interlayer insulating film 4, an interlayer insulating film 5, and a via plug 6. Each interconnect 3 includes a barrier metal layer 3a, which is an example of a first layer, and an interconnect material layer 3b, which is an example of a second layer. The via plug 6 includes a barrier metal layer 6a, which is an example of a third layer, and a plug material layer 6b, which is an example of a fourth layer.

FIG. 1A illustrates a case where the via plug 6 is formed on the interconnect 3 without any misalignment between them, while FIG. 1B illustrates a case where the via plug 6 is formed on the interconnect 3 with some misalignment between them. Hereinafter, the structure of the semiconductor device of this embodiment will be described mainly with reference to FIG. 1A and sometimes also to FIG. 1B.

The substrate 1 is, for example, a semiconductor substrate such as a silicon (Si) substrate. FIG. 1A shows an X direction and a Y direction which are parallel to the surface of the substrate 1 and perpendicular to each other, and a Z direction perpendicular to the surface of the substrate 1. In this embodiment, a +Z direction is treated as an upward direction, and a −Z direction as a downward direction. The −Z direction may or may not coincide with the direction of gravitational force.

The interlayer insulating film 2 is formed on the substrate 1. The interlayer insulating film 2 may be formed either directly or via another layer on the substrate 1. The interlayer insulating film 2 is, for example, a silicon oxide film (SiO$_2$ film).

The plurality of interconnects 3 are formed in the interlayer insulating film 2, and provided in the same interconnect layer. FIG. 1A illustrates three interconnects 3 as an example. The interconnects 3 extend in the Y direction, and are arranged side-by-side in the X direction. The interconnects 3 may be formed, for example, by forming interconnect trenches in the interlayer insulating film 2, and sequentially forming the barrier metal layer 3a and the interconnect material layer 3b in the interconnect trenches to fill the interconnect trenches with the layers. Accordingly, the barrier metal layer 3a of FIG. 1A faces the side surface and the bottom surface of the interconnect material layer 3b. The barrier metal layer 3a is, for example, a metal film including titanium (Ti), and is a Ti film in the illustrated embodiment. The interconnect material layer 3b is, for example, a metal film including copper (Cu), and is a Cu film in the illustrated embodiment. The barrier metal layer 3a may be another metal film including titanium, or a metal film containing no titanium. Examples of such a barrier metal layer 3a include a TiN (titanium nitride) film, a Ta (tantalum) film, and/or a TaN (tantalum nitride) film.

The interlayer insulating film 4 and the interlayer insulating film 5 are formed in this order on the interlayer insulating film 2 and on the interconnects 3. The interlayer insulating film 4 is, for example, a silicon carbonitride (SiCN) film. The interlayer insulating film 5 is, for example, a silicon oxide film.

The via plug 6 is formed in the interlayer insulating films 4 and 5, and is provided on one of the interconnects 3. FIG. 1A illustrates a case where the via plug 6 is provided on the central interconnect 3 of the three interconnects 3. The via plug 6 may be formed, for example, by forming a via hole on the interconnect 3 and in the interlayer insulating films 4 and 5, and sequentially forming the barrier metal layer 6a and the plug material layer 6b in the via hole to fill the hole with the layers. Accordingly, the barrier metal layer 6a of FIG. 1A faces the side surface and the bottom surface of the plug material layer 6b. The barrier metal layer 6a is, for example, a metal film including titanium (Ti), and is a TiN film in the illustrated embodiment. The plug material layer 6b is, for example, a metal film including tungsten (W), and is a W film in the illustrated embodiment. The via plug 6 of this embodiment has, for example, a circular planar shape.

The via plug 6 of FIG. 1A is in contact with the upper surface of the interconnect 3. On the other hand, the via plug 6 of FIG. 1B is in contact with the upper surface and the side surface of the interconnect 3. The via plugs 6 are both electrically connected to the interconnect 3.

Details of the via plug 6 of this embodiment will be further described with reference to FIG. 1A.

The via plug 6 of this embodiment contains chlorine (Cl) in the barrier metal layer 6a, and contains oxygen (O) in the vicinity of the interface between the barrier metal layer 6a and the plug material layer 6b. For example, when $TiCl_4$ gas is used upon the formation of the barrier metal layer 6a, chlorine will enter the barrier metal layer 6a. On the other hand, during the formation of the via plug 6 in a chamber, oxygen remaining in the chamber adheres to the surface of the barrier metal layer 6a, and the oxygen will enter the vicinity of the interface between the barrier metal layer 6a and the plug material layer 6b. Chlorine and oxygen may be present in the via plug 6 from other causes.

However, the chlorine and oxygen in the via plug 6 may react with the copper of the interconnect material layer 3b, causing a deterioration in the interconnect material layer 3b. In particular, corrosion of the copper of the interconnect material layer 3b may occur, causing a defect in the interconnect 3.

In view of the above, the via plug 6 of this embodiment is formed such that the chlorine concentration in the barrier metal layer 6a is not more than $5.0 \times 10^{21}$ atoms/cm$^3$ (or is less than or equal to $5.0 \times 10^{21}$ atoms/cm$^3$), and the oxygen concentration at the interface between the barrier metal layer 6a and the plug material layer 6b is not more than $5.0 \times 10^{21}$ atoms/cm$^3$ (or is less than or equal to $5.0 \times 10^{21}$ atoms/cm$^3$). This makes it possible to prevent copper and oxygen in the via plug 6 from deteriorating the interconnect material layer 3b.

Experiments revealed that a high chlorine concentration in the barrier metal layer 6a caused a phenomenon of disappearance of the interconnect material layer 3b due to copper corrosion and a phenomenon of segregation of chlorine at the bottom of the interconnect material layer 3b. Experiments also revealed that these phenomena did not substantially occur when the chlorine concentration in the barrier metal layer 6a was decreased to not more than $5.0 \times 10^{21}$ atoms/cm$^3$ (or decreased to less than or equal to $5.0 \times 10^{21}$ atoms/cm$^3$). Therefore, in this embodiment, the chlorine concentration in the barrier metal layer 6a is set to be not more than $5.0 \times 10^{21}$ atoms/cm$^3$ (or set to be less than or equal to $5.0 \times 10^{21}$ atoms/cm$^3$).

If a chamber for the formation of the via plug 6 is open to the atmosphere between the step of forming the barrier metal layer 6a and the step of forming the plug material layer 6b, then the oxygen concentration at the interface between the barrier metal layer 6a and the plug material layer 6b will increase. This is because air and moisture enter the chamber by opening to the atmosphere. Experiments revealed that the above-described phenomena occurred when such opening to the atmosphere was performed and then the plug material layer 6b was formed. Experiments also revealed that when the plug material layer 6b was formed without performing such opening to the atmosphere, the oxygen concentration in the vicinity of the interface between the barrier metal layer 6a and the plug material layer 6b decreased to not more than $5.0 \times 10^{21}$ atoms/cm$^3$ (or decreased to less than or equal to $5.0 \times 10^{21}$ atoms/cm$^3$), and the above-described phenomena did not substantially occur. Therefore, in this embodiment, the oxygen concentration at the interface between the barrier metal layer 6a and the plug material layer 6b is set to be not more than $5.0 \times 10^{21}$ atoms/cm$^3$ (or set to be less than or equal to $5.0 \times 10^{21}$ atoms/cm$^3$).

An example of a method for thus decreasing the chlorine concentration and the oxygen concentration will now be described with reference to FIG. 2 through FIG. 5.

FIG. 2 through FIG. 5 are cross-sectional views illustrating a method for manufacturing the semiconductor device of the first embodiment.

Figure 2A:
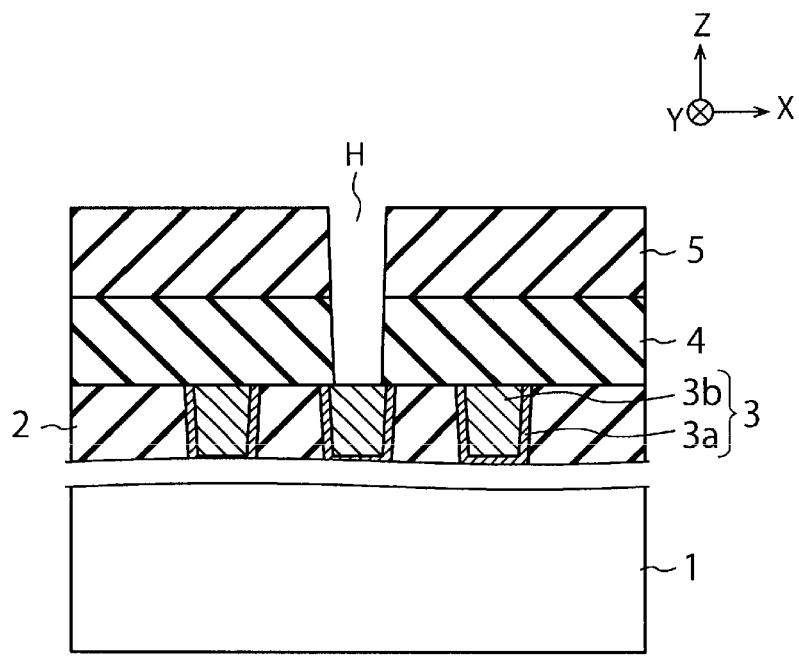
FIG. 2A and FIG. 2B are cross-sectional views illustrating a method for manufacturing the semiconductor device according to the first embodiment.
Figure 2B:
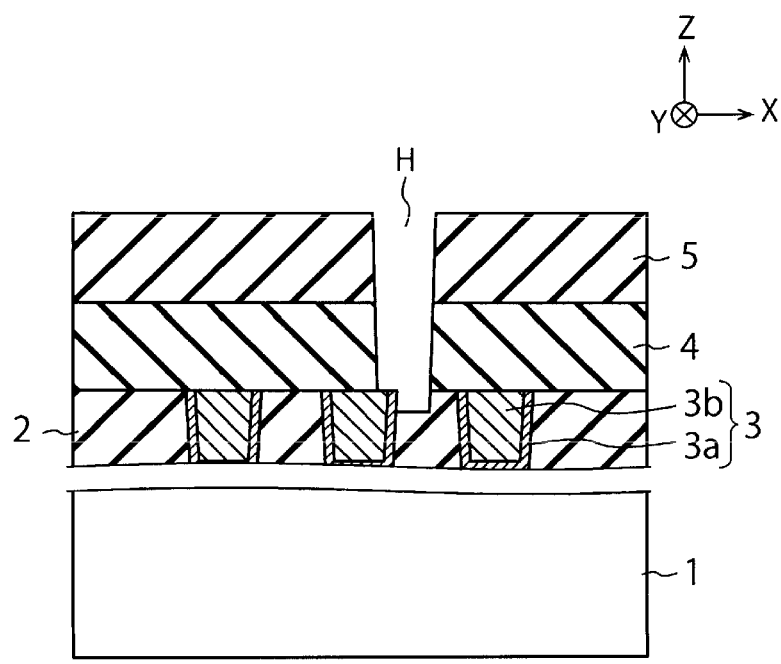

FIG. 2A and FIG. 2B are cross-sectional views corresponding to FIG. 1A and FIG. 1B, respectively. The same holds true for FIG. 3A through FIG. 5B. A method for manufacturing the semiconductor device of this embodiment will be described mainly with reference to FIG. 2A, FIG. 3A, FIG. 4A and FIG. 5A and sometimes also to FIG. 2B, FIG. 3B, FIG. 4B and FIG. 5B.

First, the interlayer insulating film 2 may be formed on the substrate 1, and the plurality of interconnects 3 may be formed in the interlayer insulating film 2. Thereafter, the interlayer insulating film 4 and the interlayer insulating film 5 may be sequentially formed on the interlayer insulating film 2 and on the interconnects 3 (FIG. 2A). The interconnects 3 may be formed by forming a plurality of interconnect trenches in the interlayer insulating film 2, and sequentially forming the barrier metal layer 3a and the interconnect material layer 3b in the interconnect trenches to fill the interconnect trenches with the layers. The barrier metal layer 3a is, for example, a Ti film formed by sputtering. The interconnect material layer 3b is, for example, a Cu film formed by plating.

Next, a via hole H, reaching one of the interconnects 3, may be formed in the interlayer insulating films 4 and 5 (FIG. 2A). As a result, the upper surface of the interconnect 3 may become exposed in the via hole H. In FIG. 2B, the via hole H may be misaligned with the interconnect 3, and the upper surface and the side surface of the interconnect 3 may be exposed in the via hole H.

Figure 3A:
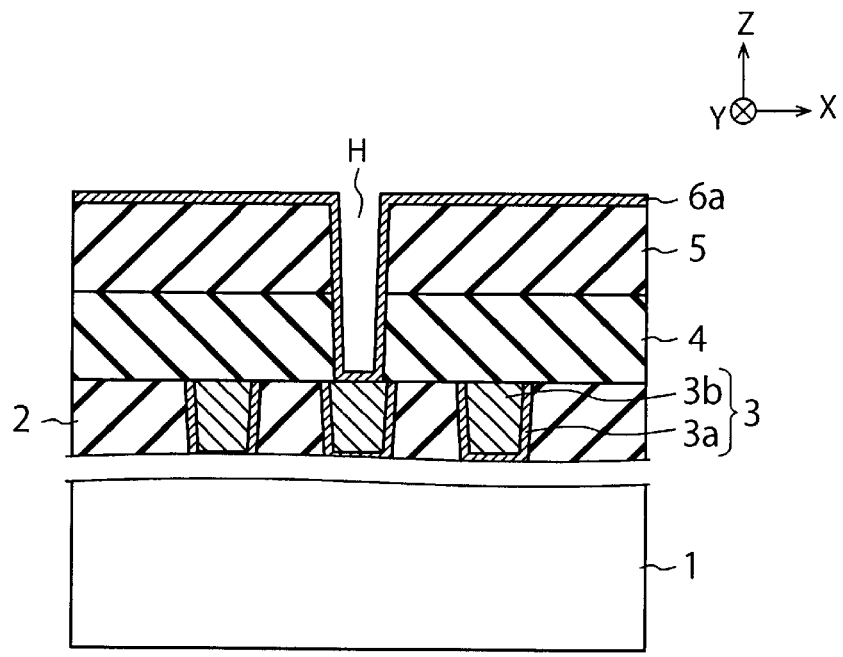
FIG. 3A and FIG. 3B are cross-sectional views illustrating the method for manufacturing the semiconductor device according to the first embodiment.
Figure 3B:
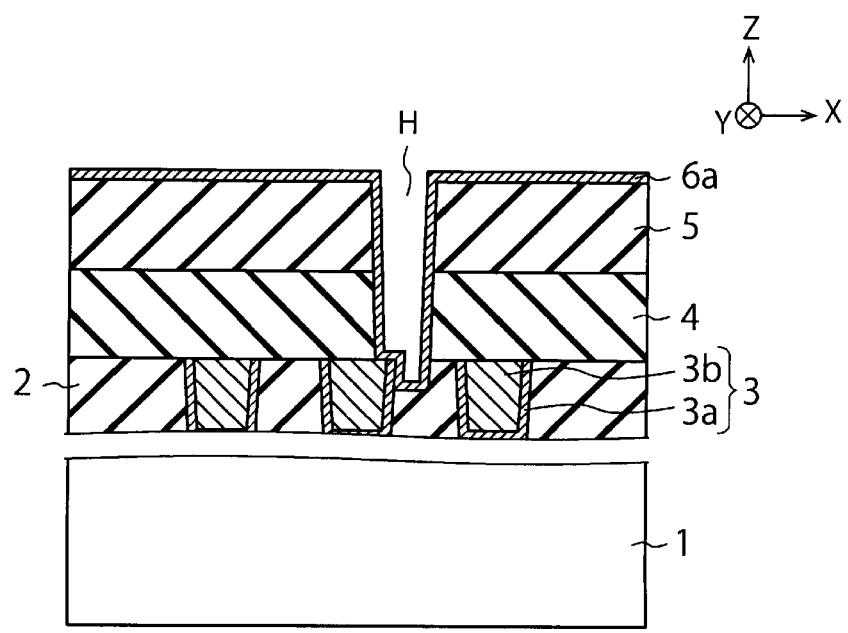

Next, the barrier metal layer 6a may be formed over the entire surface of the substrate 1 (FIG. 3A). As a result, the barrier metal layer 6a may be formed on the side surface and the bottom surface of the via hole H. The barrier metal layer 6a is, for example, a TiN film formed by CVD (Chemical Vapor Deposition) using a first gas including titanium and chlorine, and a second gas including nitrogen and hydrogen. For example, the first gas includes $TiCl_4$ gas and the second gas includes $NH_3$ (ammonia) gas. The barrier metal layer 6a, formed by using these gases, may contain chlorine as an impurity.

In the step of FIG. 3A, after the formation of the barrier metal layer 6a, a chlorine removal treatment may be performed to remove chlorine from the barrier metal layer 6a. The chlorine removal treatment is carried out, for example, by heat-treating the barrier metal layer 6a with $NH_3$ gas for at least 30 seconds at the same temperature as that in the formation of the barrier metal layer 6a. The chlorine removal treatment can adjust the chlorine concentration in the barrier metal layer 6a to be not more than $5.0 \times 10^{21}$ atoms/$cm^3$ (or to be less than or equal to $5.0 \times 10^{21}$ atoms/$cm^3$).

The step of FIG. 3A may also be permed, for example, in the following manner. First, the substrate 1 after the step of FIG. 2A may be carried into a chamber of a plasma CVD apparatus. This apparatus is, for example, a parallel plate-type plasma CVD apparatus including a heating stage that functions as a lower electrode, and a shower head that functions as an upper electrode. Next, after introducing $TiCl_4$ gas, $H_2$ (hydrogen) gas and Ar (argon) gas into the chamber, a high-frequency voltage may be applied between the electrodes (first treatment). A Ti film may be formed over the entire surface of the substrate 1 by the plasma CVD treatment. The Ti film may contain chlorine. Next, an $NH_3$ plasma treatment using $NH_3$ gas and Ar gas may be performed in the chamber (second treatment). This treatment may allow chlorine in the Ti film to react with $NH_3$ to form ammonium chloride which vaporizes. Chlorine can thus be removed from the Ti film. Simultaneously with the reaction of chlorine with $NH_3$, the Ti film may react with $NH_3$ and changes to a TiN film (barrier metal layer 6a). A barrier metal layer 6a having a chlorine concentration of not more than $5.0 \times 10^{21}$ atoms/$cm^3$ (or a chlorine concentration of less than or equal to $5.0 \times 10^{21}$ atoms/$cm^3$) may be formed in this manner.

In this embodiment, the barrier metal layer 6a may be formed by alternately repeating the first treatment including supplying the first gas under plasma conditions, and the second treatment including supplying the second gas under plasma conditions. Accordingly, the barrier metal layer 6a may include a TiN film formed by the repetition of the first and second treatments. Thus, the barrier metal layer 6a of this embodiment may be formed by alternately supplying the first gas and the second gas.

In some embodiments, the higher the temperature is in the chamber during the first and second treatments, the lower the chlorine concentration is in the barrier metal layer 6a. However, if the temperature in the chamber is too high, it is possible that the copper of the interconnect material layer 3b may condense, thereby the reliability reducing of the interconnects 3. Therefore, the first and second treatments of this embodiment may be performed in the chamber at a temperature of not less than 300° C. and not more than 430° C. (or a temperature of greater than equal to 300° C. and less than equal to 430° C.). This is because if the temperature is less than 300° C., it is possible that the chlorine concentration in the barrier metal layer 6a cannot be sufficiently decreased. If the temperature is more than 430° C., it is possible that copper may condense. By forming the barrier metal layer 6a at a temperature of not less than 300° C. and not more than 430° C. (or a temperature of greater than or equal to 300° C. and less than or equal to 430° C.) according to this embodiment, it becomes possible to decrease the chlorine concentration in the barrier metal layer 6a while preventing condensation of the copper of the interconnect material layer 3b.

Figure 4A:
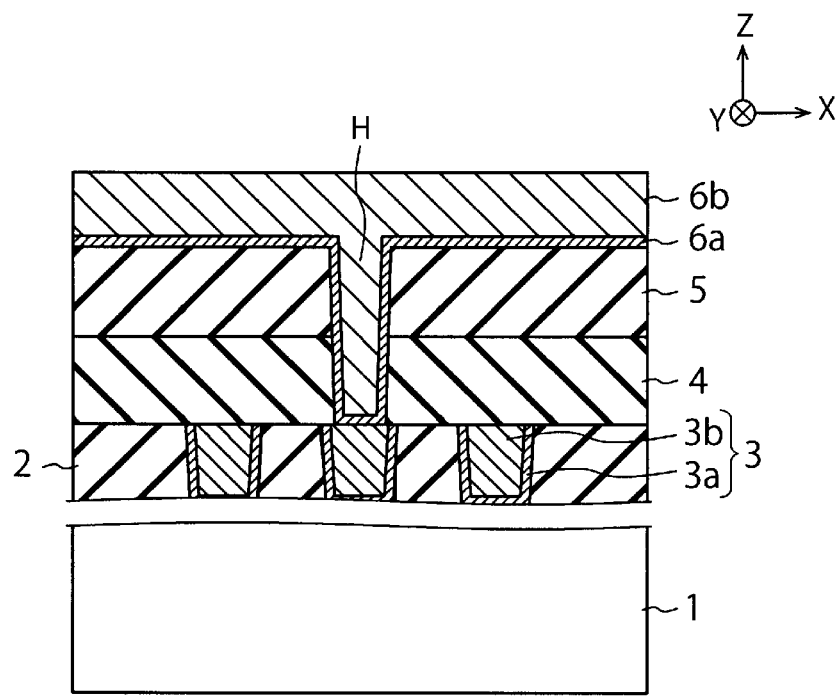
FIG. 4A and FIG. 4B are cross-sectional views illustrating the method for manufacturing the semiconductor device according to the first embodiment.
Figure 4B:
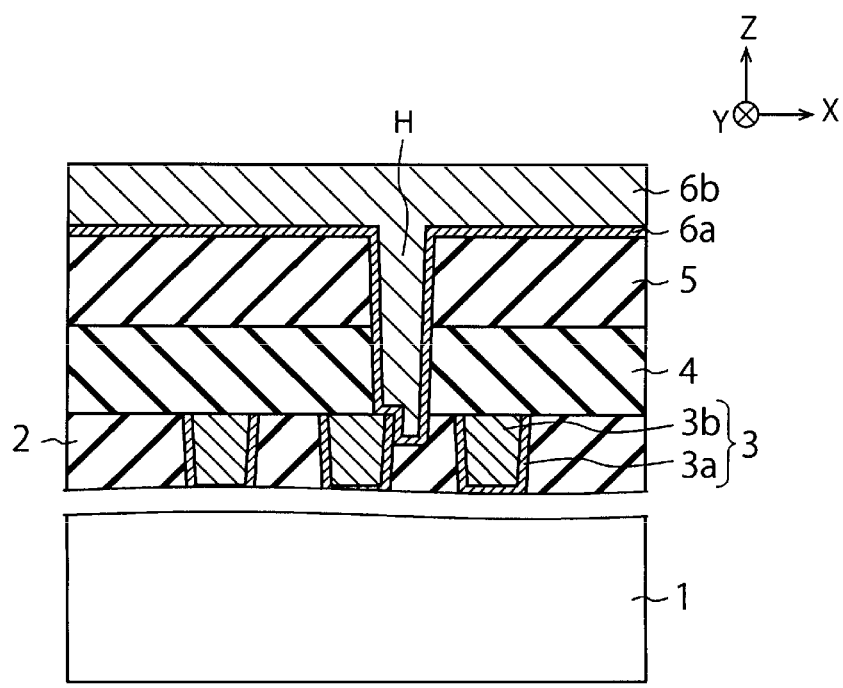

Next, the plug material layer 6b may be formed over the entire surface of the substrate 1 (FIG. 4A). As a result, the plug material layer 6b may be formed in the via hole H and on the barrier metal layer 6a. The plug material layer 6b is, for example, a W (Tungsten) film formed by CVD (Chemical Vapor Deposition) using a gas containing tungsten. The gas includes, for example, a $WF_6$ gas (F represents fluorine).

The plug material layer 6b of this embodiment may be formed under vacuum conditions continuous from the formation of the barrier metal layer 6a. In particular, the plug material layer 6b may be formed in the same chamber as the chamber in which the barrier metal layer 6a was formed, and in some embodiments, the substrate 1 is not carried out of the chamber between the step of forming the barrier metal layer 6a and the step of forming the plug material layer 6b. Furthermore, in some embodiments, the chamber is not open to the atmosphere between the step of forming the barrier metal layer 6a and the step of forming the plug material layer 6b. The plug material layer 6b can therefore be formed such that the oxygen concentration at the interface between the barrier metal layer 6a and the plug material layer 6b is not more than $5.0 \times 10^{21}$ atoms/$cm^3$ (or less than or equal to $5.0 \times 10^{21}$ atoms/$cm^3$).

Figure 5A:
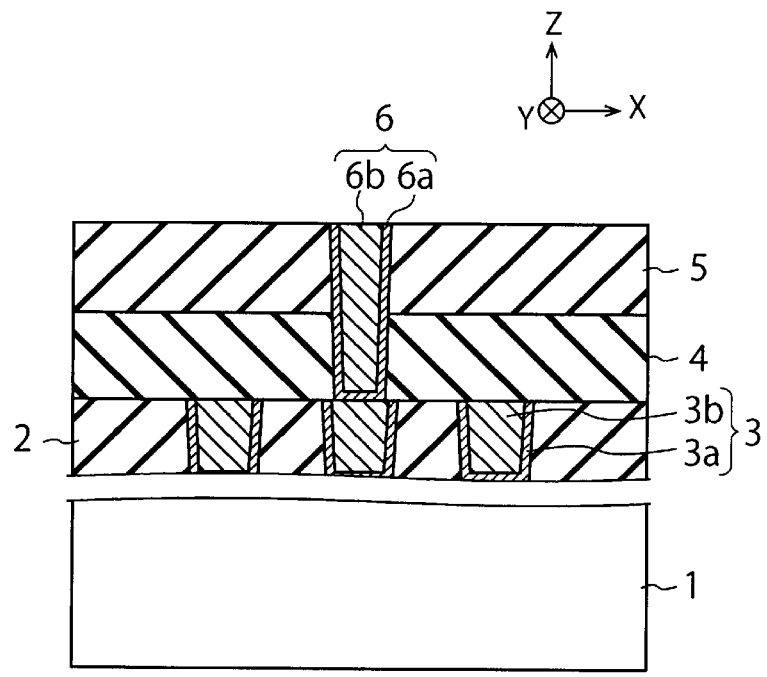
FIG. 5A and FIG. 5B are cross-sectional views illustrating the method for manufacturing the semiconductor device according to the first embodiment.
Figure 5B:
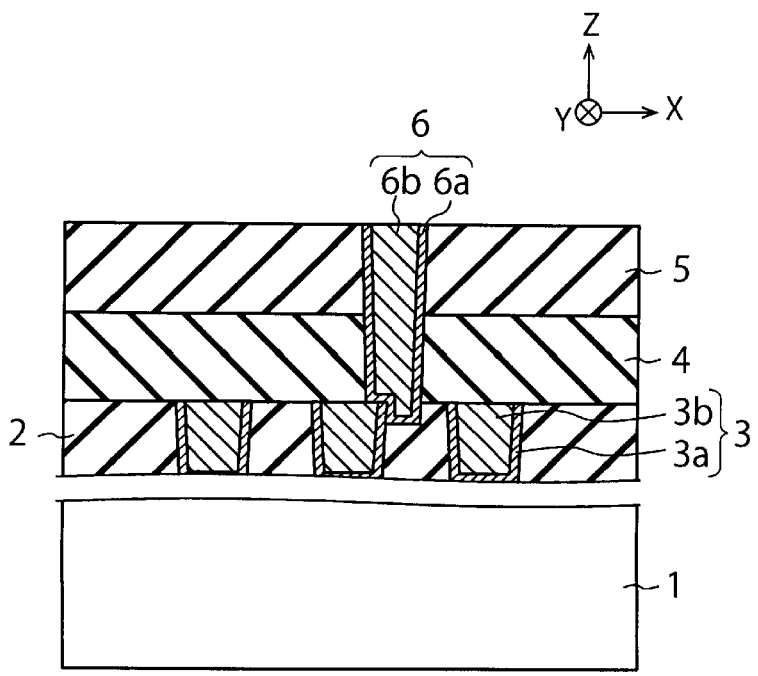

Next, the surface of the plug material layer 6b may be planarized by CMP (Chemical Mechanical Polishing) (FIG. 5A). As a result, the plug material layer 6b and the barrier metal layer 6a, lying outside the via hole H, may be removed to form the via plug 6 in the via hole H. The via plug 6 of this embodiment may be formed in contact with the interconnect 3, and therefore is electrically connected to the interconnect 3. The same holds true for the via plug 6 of FIG. 5B.

Thereafter, various interlayer insulating films, interconnect layers, plug layers, etc. may be formed on the substrate 1. The semiconductor device of this embodiment thus can be manufactured.

Figure 6:
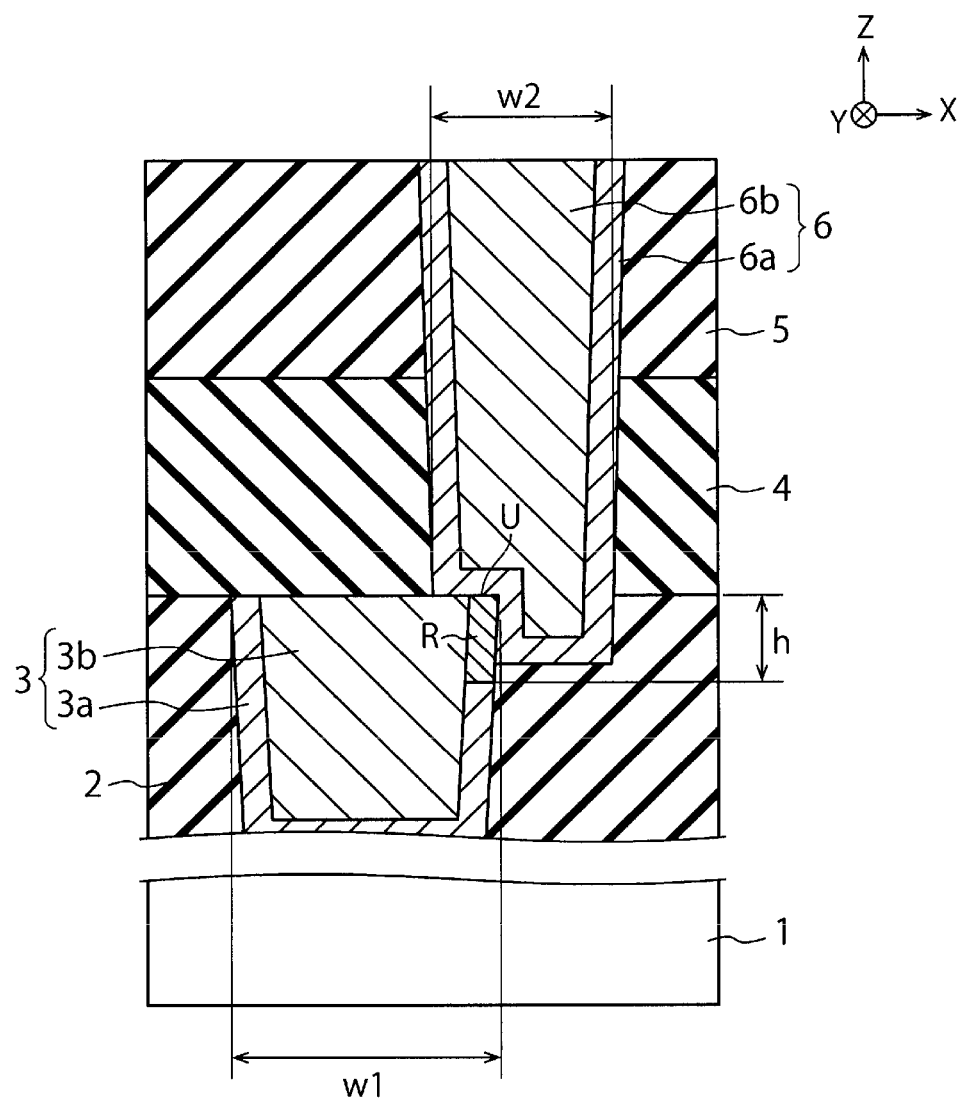
FIG. 6 is a cross-sectional view showing an example of a structure of the semiconductor device according to the first embodiment.

FIG. 6 is a cross-sectional view showing an example of a structure of the semiconductor device of the first embodiment. FIG. 6 is a cross-sectional view corresponding to FIG. 1B.

FIG. 6 shows a width w1 of the upper surface of the interconnect 3 and a diameter w2 of the via plug 6 at the level of the upper surface of the interconnect 3. In this embodiment, the width w1 of the interconnect 3 may be set to be larger than the diameter w2 of the via plug 6 (w1>w2), and the difference between the width w1 of the interconnect 3 and the diameter w2 of the via plug 6 may be set to be small. For example, the difference between the width w1 of the interconnect 3 and the diameter w2 of the via plug 6 may be set to be not more than 15 nm ((w1−w2)≤15 nm). The width w1 of the interconnect 3 is, for example, about 20 nm, and the diameter w2 of the via plug 6 is, for example, about 10 nm.

When the via plug 6 is formed on the interconnect 3 with a misalignment between them, the distance of the misalignment of the via plug 6 may generally be about 15 nm at the maximum. Accordingly, if the difference between the width w1 of the interconnect 3 and the diameter w2 of the via plug 6 is not more than 15 nm (or is less than or equal to 15 nm), it is possible that part of the bottom surface of the via plug 6 may be formed outside the upper surface of the interconnect 3. In FIG. 6, part of the bottom surface of the via plug 6 may be formed outside the upper surface of the interconnect 3; therefore, part of the upper end of the barrier metal layer 3a may be in contact with the barrier metal layer 6a of the via plug 6.

The symbol U denotes that upper end of the barrier metal layer 3a of the interconnect 3 which is in contact with the barrier metal layer 6a of the via plug 6. The barrier metal layer 3a shown in FIG. 6 may have the right-hand upper end and the left-hand upper end, and the right-hand upper end corresponds to the upper end U in contact with the barrier metal layer 6a.

The upper end U of the barrier metal layer 3a may be exposed in the via hole H in the step of FIG. 2B. Accordingly, upon the formation of the barrier metal layer 6a in the step of FIG. 3B, chlorine may diffuse through the inside the barrier metal layer 3a or through the interface between the barrier metal layer 3a and the interconnect material layer 3b, and chlorinate the surface of the barrier metal layer 3a. The chlorination of the surface of the barrier metal layer 3a may reduce the adhesion between the barrier metal layer 3a and the interconnect material layer 3b, thus reducing the reliability of the interconnects 3.

Therefore, in this embodiment, the upper end U of the barrier metal layer 3a may be nitrided by, for example, $NH_3$ heat treatment or $NH_3$ plasma treatment. This makes it possible to prevent chlorine from diffusing from the upper end U of the barrier metal layer 3a through the inside the barrier metal layer 3a or through the interface between the barrier metal layer 3a and the interconnect material layer 3b. By thus preventing the diffusion of chlorine, it becomes possible to prevent the reduction in the adhesion between the barrier metal layer 3a and the interconnect material layer 3b, thereby preventing the reduction in the reliability of the interconnect 3.

FIG. 6 shows a nitrided portion R formed in the barrier metal layer 3a and located at and near the upper end U of the barrier metal layer 3a. The nitrided portion R may be formed by nitriding the upper end U and its vicinity of the barrier metal layer 3a before the formation of the barrier metal layer 6a. The barrier metal layer 3a is, for example, a Ti film, and the nitrided portion R is, for example, a TiN film. FIG. 6 shows the size or thickness h of the nitrided portion R in the height direction (Z direction). The size h of the nitrided portion R in the height direction is, for example, not more than 10 nm ($h \leq 10$ nm).

In this embodiment, the main component of the barrier metal layer 3a may be titanium (Ti), and the main component of the interconnect material layer 3b may be copper (Cu). This makes it possible to diffuse a small amount of Ti atoms from the barrier metal layer 3a into the interconnect material layer 3b, thereby improving the reliability of the interconnect 3. When the main component of the barrier metal layer 3a is titanium, the nitrided portion R may be a TiN film. Accordingly, the surface of the interconnect material layer 3b can be covered with the nitrided portion R which is a TiN film, and with the barrier metal layer 6a which is a TiN film. Thus, the surface of the interconnect material layer 3b can be covered with the same material (TiN). This makes it possible to prevent a reduction in the adhesion between the barrier metal layer 3a and the interconnect material layer 3b due to different materials covering the surface of the interconnect material layer 3b, thereby preventing a reduction in the reliability of the interconnect 3.

The reduction in the reliability of the interconnect 3 can also be prevented by forming a TiN film as the barrier metal layer 3a in the step of FIG. 2B.

Figure 7:
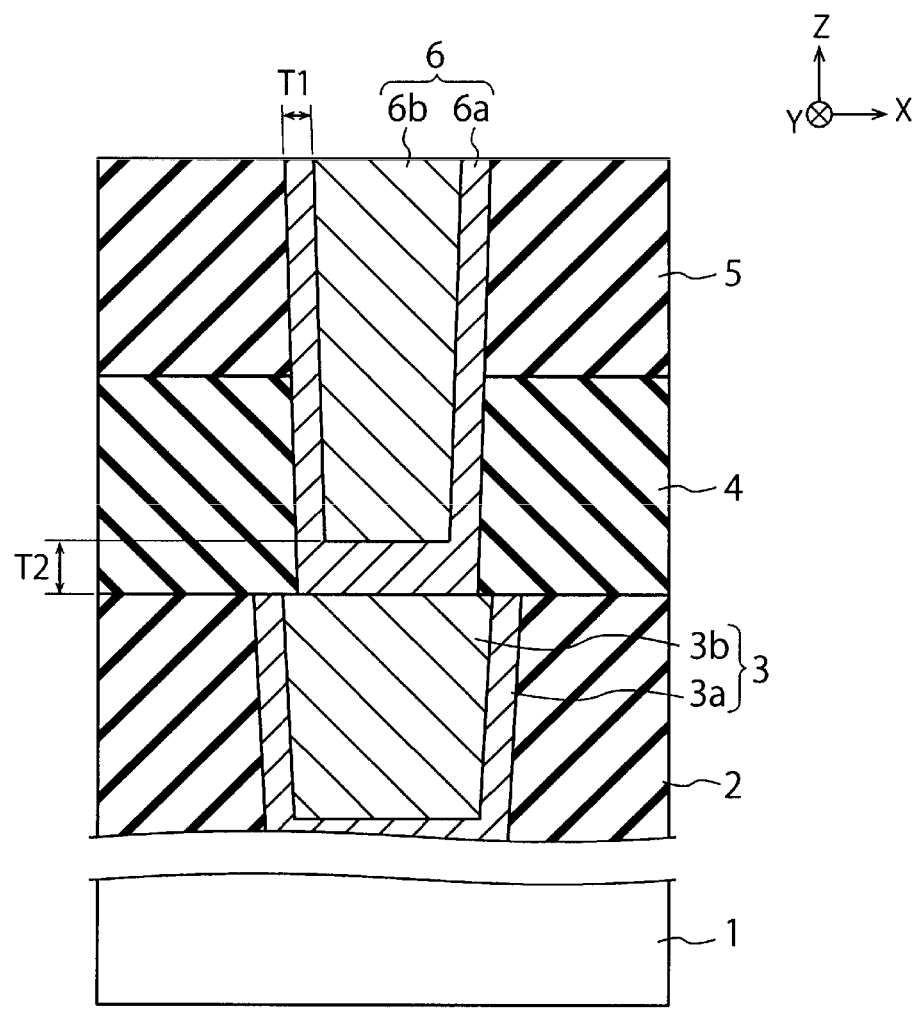
FIG. 7 is a cross-sectional view showing another example of the structure of the semiconductor device according to the first embodiment.

FIG. 7 is a cross-sectional view showing another example of the structure of the semiconductor device of the first embodiment. FIG. 7 is a cross-sectional view corresponding to FIG. 1A.

As described above, the via plug 6 of this embodiment is formed, for example, by forming the via hole H in the interlayer insulating films 4 and 5, and sequentially forming the barrier metal layer 6a and the plug material layer 6b in the via hole H to fill the via hole H with the layers. Accordingly, the barrier metal layer 6a may include a side portion that faces the side surface of the plug material layer 6b, and a bottom portion that faces the bottom surface of the plug material layer 6b. The side portion of the barrier metal layer 6a may be an example of a first portion, and the bottom portion of the barrier metal layer 6a may be an example of a second portion.

FIG. 7 shows a thickness T1 of the side portion of the barrier metal layer 6a, and a thickness T2 of the bottom portion of the barrier metal layer 6a. In this embodiment, the thickness T1 of the side portion of the barrier metal layer 6a may be set to be smaller than the thickness T2 of the bottom portion of the barrier metal layer 6a (T1<T2), for example, not more than one-half of the thickness T2 of the bottom portion of the barrier metal layer 6a (T1≤T2/2). Such a barrier metal layer 6a may be formed, for example, by depositing the barrier metal layer 6a by plasma CVD.

By making the thickness T1 of the side portion of the barrier metal layer 6a small while making the thickness T2 of the bottom portion of the barrier metal layer 6a large according to this embodiment, it becomes possible to reduce the volume of the barrier metal layer 6a while securing a long distance between the interconnect material layer 3b and the plug material layer 6b. It therefore becomes possible to reduce the amount of chlorine atoms in the barrier metal layer 6a, thereby further reducing corrosion of the interconnect material layer 3b.

As described hereinabove, in some embodiments, the via plug 6 of this embodiment is formed such that the chlorine concentration in the barrier metal layer 6a is not more than $5.0 \times 10^{21}$ atoms/cm³ (or is less than or equal to $5.0 \times 10^{21}$ atoms/cm³), and the oxygen concentration at the interface between the barrier metal layer 6a and the plug material layer 6b is not more than $5.0 \times 10^{21}$ atoms/cm³ (or is less than or equal to $5.0 \times 10^{21}$ atoms/cm³). Therefore, according to this embodiment, it becomes possible to prevent a deterioration in the interconnect 3 due to the influence of the via plug 6.

The interconnect 3 and the via plug 6 are, for example, a bit line and a via plug for the bit line, respectively, of a three-dimensional memory. A specific example of the interconnect 3 and the via plug 6 according to a second embodiment will now be described.

Second Embodiment

Figure 8:
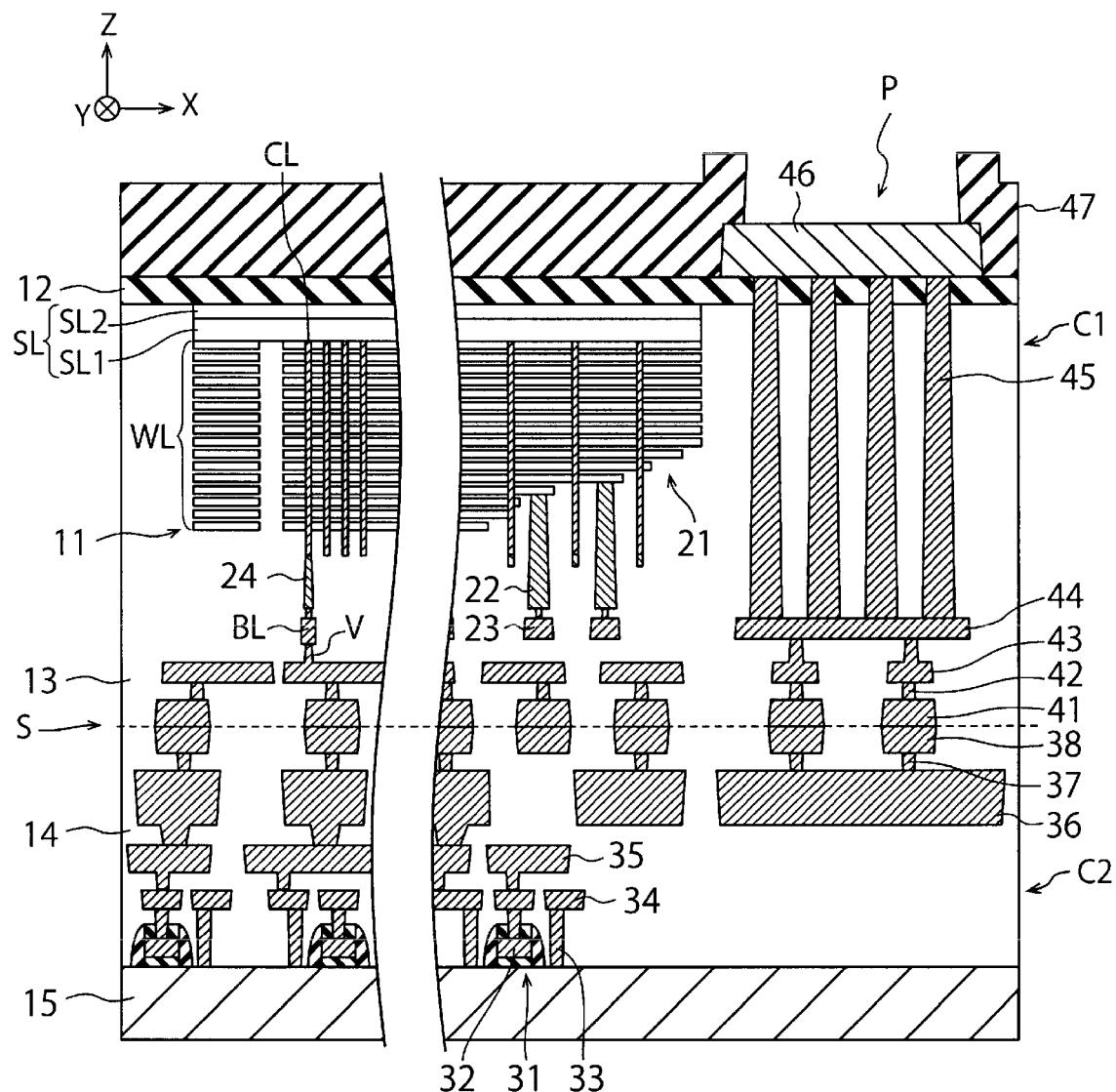
FIG. 8 is a cross-sectional view showing the structure of a semiconductor device according to a second embodiment.

FIG. 8 is a cross-sectional view showing the structure of a semiconductor device according to a second embodiment. The semiconductor device of FIG. 8 is a three-dimensional memory obtained by bonding an array wafer and a circuit wafer together, and includes an array section C1 from the array wafer, and a circuit section C2 from the circuit wafer.

The array section C1 may include a memory cell array 11 including a plurality of memory cells arranged three-dimensionally, an insulating film 12 on the memory cell array 11, and an interlayer insulating film 13 located below the memory cell array 11. The insulating film 12 is, for example, a silicon oxide film or a silicon nitride film. The interlayer insulating film 13 is, for example, a silicon oxide film, or a stacked film composed of a silicon oxide film and other insulating film.

The circuit section C2 may be provided under the array section C1. The symbol S denotes a bonding interface between the array section C1 and the circuit section C2. The circuit section C2 may include an interlayer insulating film 14, and a substrate 15 located below the interlayer insulating film 14. The interlayer insulating film 14 is, for example, a silicon oxide film, or a stacked film composed of a silicon oxide film and other insulating film. The substrate 15 is, for example, a semiconductor substrate such as a silicon substrate. FIG. 8 shows an X direction and a Y direction which are parallel to the surface of the substrate 15 and perpendicular to each other, and a Z direction perpendicular to the surface of the substrate 15. In this embodiment, a +Z direction is treated as an upward direction, and a −Z direction as a downward direction. The −Z direction may or may not coincide with the direction of gravitational force.

The array section C1 may include word lines WL and a source line SL as a plurality of electrode layers in the memory cell array 11. FIG. 8 shows a step-like structural portion 21 of the memory cell array 11. Each word line WL may be electrically connected to a word interconnect layer 23 via a contact plug 22. Columnar portions CL, penetrating the plurality of word lines WL, may be each electrically connected to a bit line BL via a via plug 24, and electrically connected to the source line SL. The source line SL may include a first layer SL1 which is a semiconductor layer, and a second layer SL2 which is a metal layer. The symbol V denotes a via plug provided under the bit line BL.

The circuit section C2 may include a plurality of transistors 31. Each transistor 31 may include a gate electrode 32 provided on the substrate 15 via a gate insulating film, and a source diffusion layer and a drain diffusion layer, both not shown, provided in the substrate 15. The circuit section C2 may also include a plurality of contact plugs 33 provided on the source diffusion layers and the drain diffusion layers of the transistors 31, an interconnect layer 34 provided on the contact plugs 33 and including a plurality of interconnects, and an interconnect layer 35 provided on the interconnect layer 34 and including a plurality of interconnects.

The circuit section C2 may further include an interconnect layer 36 provided on the interconnect layer 35 and including a plurality of interconnects, a plurality of via plugs 37 provided on the interconnect layer 36, and a plurality of metal pads 38 provided on the via plugs 37. Each metal pad 38 is, for example, a Cu (copper) layer or an Al (aluminum) layer. The circuit section C2 may function as a control circuit (logic circuit) for controlling the operation of the array section C1. The control circuit may be composed of the transistors 31, etc., and may be electrically connected to the metal pads 38.

The array section C1 may include a plurality of metal pads 41 provided on the metal pads 38, and a plurality of via plugs 42 provided on the metal pads 41. The array section C1 may also include an interconnect layer 43 provided on the via plugs 42 and including a plurality of interconnects, and an interconnect layer 44 provided on the interconnect layer 43 and including a plurality of interconnects. Each metal pad 41 is, for example, a Cu layer or an Al layer. The above-described via plug V is provided in the interconnect layer 43.

The array section C1 may further include a plurality of via plugs 45 provided on the interconnect layer 44, a metal pad 46 provided on the via plugs 45 and on the insulating film 12, and a passivation film 47 provided on the metal pad 46 and on the insulating film 12. The metal pad 46 is, for example, a Cu layer or an Al layer, and functions as an external connection pad (bonding pad) of the semiconductor device of FIG. 8. The passivation film 47 is, for example, an insulating film such as a silicon oxide film, and has an opening P in which the upper surface of the metal pad 46 is exposed. The metal pad 46 can be connected to a mounting substrate or another device via the opening P by means of, for example, bonding wires, solder balls, or metal bumps.

Figure 9:
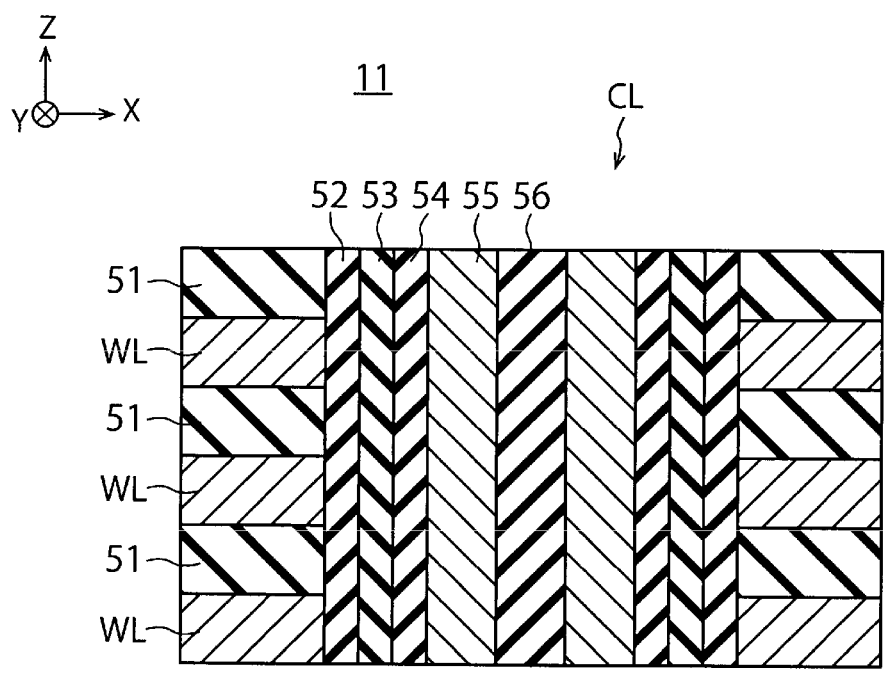
FIG. 9 is a cross-sectional view showing the structure of a columnar portion according to the second embodiment.

FIG. 9 is a cross-sectional view showing the structure of the columnar portion CL of the second embodiment.

As shown in FIG. 9, the memory cell array 11 includes the plurality of word lines WL and the plurality of insulating layers 51, stacked alternately on the interlayer insulating film 13 (FIG. 8). Each word line WL is, for example, a W (tungsten) layer. Each insulating layer 51 is, for example, a silicon oxide film.

The columnar portion CL may include a block insulating film 52, a charge storage layer 53, a tunnel insulating film 54, a channel semiconductor layer 55, and a core insulating film 56, formed in this order. The charge storage layer 53 is, for example, a silicon nitride film, and is formed on the side surfaces of the word lines WL and the insulating layers 51 via the block insulating film 52. The charge storage layer 53 may also be a semiconductor layer such as a polysilicon layer. The channel semiconductor layer 55 is, for example, a polysilicon layer, and is formed on the side surface of the charge storage layer 53 via the tunnel insulating film 54. Each of the block insulating film 52, the tunnel insulating film 54 and the core insulating film 56 is, for example, a silicon oxide film or a metal insulating film.

Figure 10:
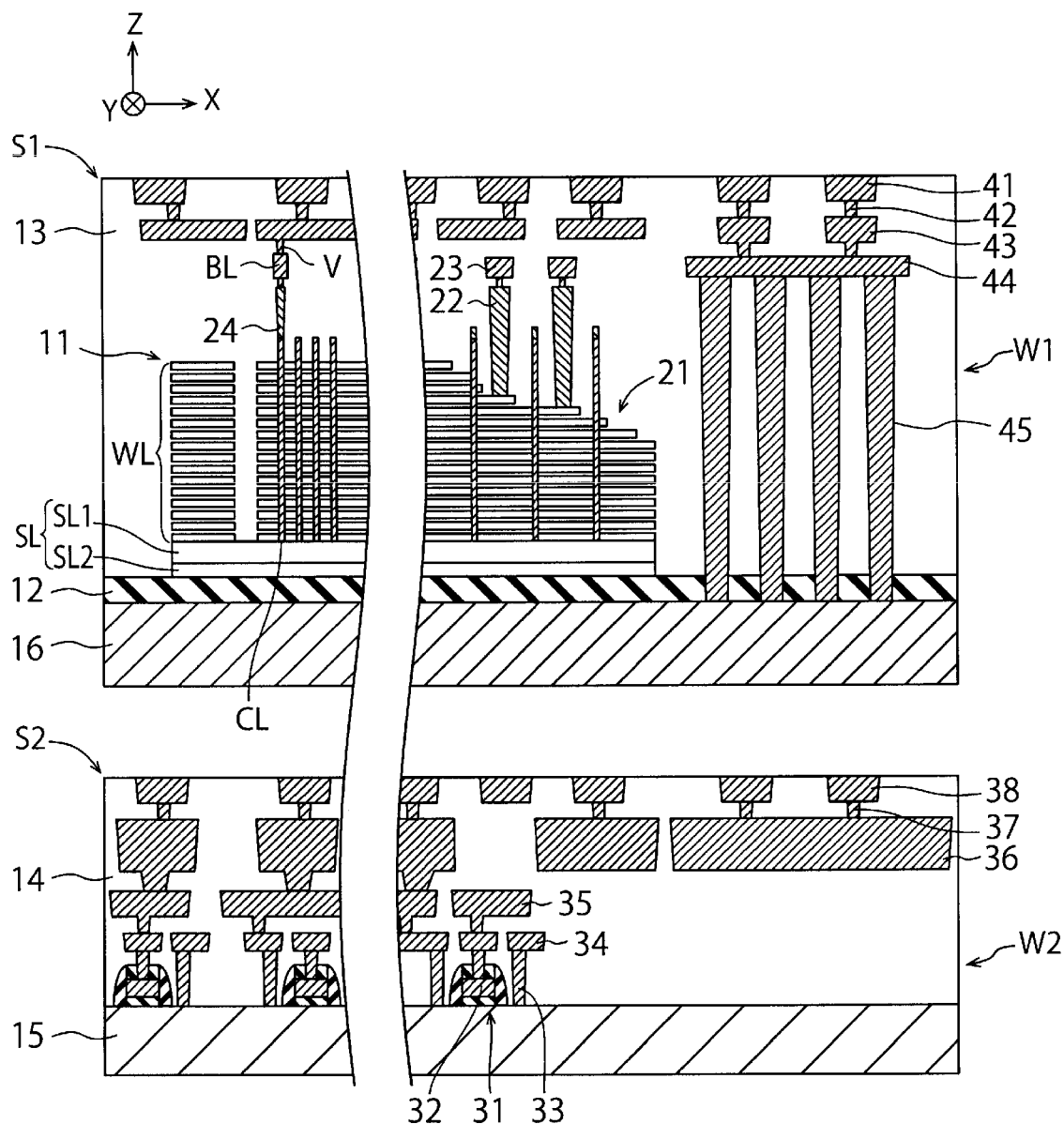
FIG. 10 is a cross-sectional view illustrating a method for manufacturing the semiconductor device according to the second embodiment.

FIG. 10 is a cross-sectional view illustrating a method for manufacturing the semiconductor device of the second embodiment. FIG. 10 shows an array wafer W1 including a plurality of array sections C1, and a circuit wafer W2 including a plurality of circuit sections C2. The array wafer W1 is also called a memory wafer, and the circuit wafer W2 is also called a CMOS wafer.

It is to be noted that the direction of the array wafer W1 of FIG. 10 is opposite to the direction of the array section C1 of FIG. 8. In this embodiment, the semiconductor device may be manufactured by bonding the array wafer W1 and the circuit wafer W2 together. FIG. 10 shows the array wafer W1 before it is inverted for the bonding, while FIG. 8 shows the array portion C1 after the wafer W1 is inverted for the bonding and bonded to the wafer W2, and is then diced.

In FIG. 10, the symbol S1 denotes the upper surface of the array wafer W1, and the symbol S2 denotes the upper surface of the circuit wafer W2. The array wafer W1 may include a substrate 16 provided under the insulating film 12. The substrate 16 is, for example, a semiconductor substrate such as a silicon substrate.

In this embodiment, as shown in FIG. 10, a memory cell array 11, an insulating film 12, an interlayer insulating film 13, a step-like structural portion 21, metal pads 41, etc. may be formed on the substrate 16 of the array wafer W1, while an interlayer insulating film 14, transistors 31, metal pads 38, etc. are formed on the substrate 15 of the circuit wafer W2. For example, via plugs 45, an interconnect layer 44, an interconnect layer 43, via plugs 42, and the metal pads 41 may be sequentially formed on the substrate 16, while contact plugs 33, an interconnect layer 34, an interconnect layer 35, an interconnect layer 36, via plugs 37, and metal pads 38 are sequentially formed on the substrate 15. Next, the array wafer W1 and the circuit wafer W2 may be bonded together by the application of mechanical pressure, whereby the interlayer insulating film 13 and the interlayer insulating film 14 are bonded together. Next, the array wafer W1 and the circuit wafer W2 may be annealed at 400° C., whereby the metal pads 41 and the metal pads 38 are bonded together.

Subsequently, the substrate 15 may be thinned by CMP (Chemical Mechanical Polishing), and the substrate 16 is removed by CMP. Thereafter, the array wafer W1 and the circuit wafer W2 may be diced into chips. The semiconductor device of FIG. 8 may be manufactured in this manner. The metal pad 46 and the passivation film 47 may be formed on the insulating film 12 after the thinning of the substrate 15 and the removal of the substrate 16.

Though in this embodiment an array wafer W1 and a circuit wafer W2 are bonded together, it is possible to bond array wafers W1 together. The description given above with reference to FIG. 8 through FIG. 10, and the description given below with reference to FIG. 11 are applicable to the case of bonding array wafers W1 together.

While FIG. 8 shows the interface between the interlayer insulating film 13 and the interlayer insulating film 14, or between the metal pads 41 and the metal pads 38, the interface generally cannot be observed after the above-described annealing. However, the site where the interface existed can be estimated, for example, from the inclination of the side surface of each metal pad 41 or the side surface of each metal pad 38, or by detecting a misalignment between the side surface of each metal pad 41 and the side surface of the corresponding metal pad 38.

The structure of the semiconductor device of the first embodiment may be applicable to the array section C1 of the second embodiment. Hereinafter, example of such a structure will be described with reference to FIG. 11.

Figure 11A:
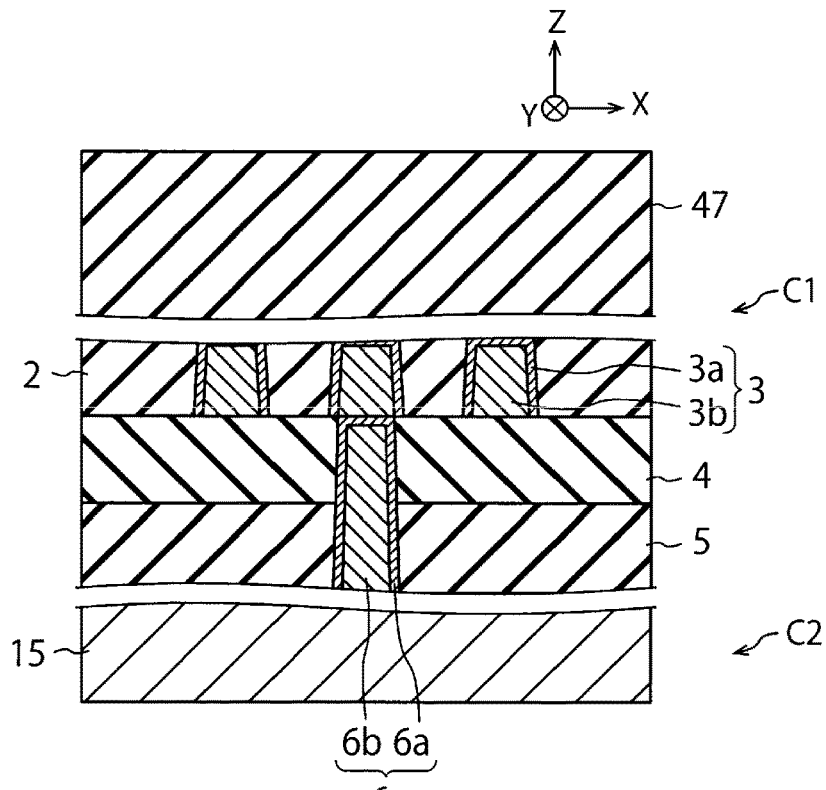
FIG. 11A and FIG. 11B are cross-sectional views showing an example of a structure of the semiconductor device according to the second embodiment.
Figure 11B:
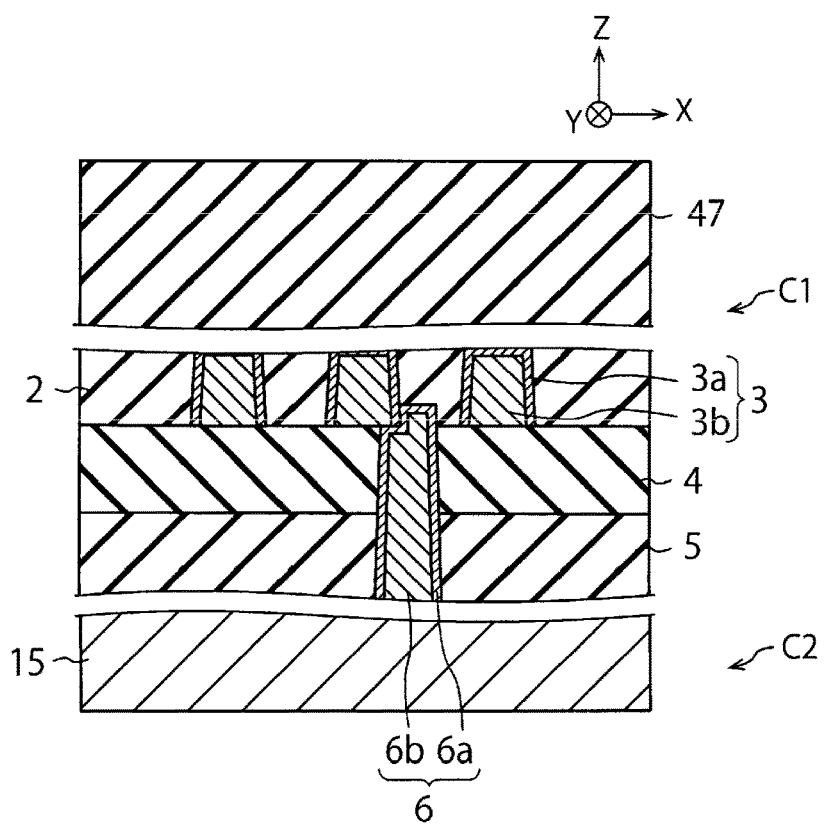

FIG. 11A and FIG. 11B are cross-sectional views showing an example of a structure of the semiconductor device of the second embodiment.

The semiconductor device of this embodiment may be obtained by applying the structure of the semiconductor device of the first embodiment to the array section C1 of the second embodiment. FIG. 11A illustrates a case where a via plug 6 is formed on an interconnect 3 without any misalignment with the interconnect 3, while FIG. 11B illustrates a case where a via plug 6 is formed on an interconnect 3 with some misalignment with the interconnect 3. It is to be noted that the semiconductor device of this embodiment has been manufactured through bonding of the array wafer W1 and the circuit wafer W2; therefore, the direction of the array section C1 in FIG. 11A and FIG. 11B is opposite to the direction of the semiconductor device in FIG. 1A and FIG. 1B.

Hereinafter, structure of the semiconductor device of this embodiment will be described with reference to FIG. 11A. The description is applicable to FIG. 11B.

In the manufacturing of the semiconductor device of this embodiment, the steps of FIG. 2 through FIG. 5 are first performed to produce an array wafer W1 having the structure shown in FIG. 1A; however, the interlayer insulating film 2, the interconnects 3, the interlayer insulating film 4, the interlayer insulating film 5, and the via plug 6 may be formed on the substrate 16 instead of the substrate 1. Next, as described above with reference to FIG. 10, the array wafer W1 and a circuit wafer W2 may be bonded together, followed by dicing, etc. The semiconductor device of FIG. 11A may be manufactured in this manner.

The interconnect 3 and the via plug 6 according to this embodiment are, for example, the bit line BL and the via plug V, shown in FIG. 8. It is to be noted that while the via plug 6 may be formed over the interconnect 3 in FIG. 1A, the via plug 6 (via plug V) is formed under the interconnect 3 (bit line BL) in FIG. 8 and FIG. 11A. When the direction of the semiconductor device shown in FIG. 8 and FIG. 11A is inverted, the via plug 6 (via plug V) may lie over the interconnect 3 (bit line BL).

As described above with reference to the first embodiment, the via plug 6 of this embodiment may be formed such that the chlorine concentration in the barrier metal layer 6a is not more than $5.0\times10^{21}$ atoms/cm$^3$ (or is less than or equal to $5.0\times10^{21}$ atoms/cm$^3$), and the oxygen concentration at the interface between the barrier metal layer 6a and the plug material layer 6b is not more than $5.0\times10^{21}$ atoms/cm$^3$ (or is less than or equal to $5.0\times10^{21}$ atoms/cm$^3$). This makes it possible to prevent a deterioration in the interconnect 3 due to the influence of the via plug 6. The interconnect 3 and the via plug 6 are, for example, the bit line BL and the via plug V.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
    forming an interconnect including (i) a first layer, and (ii) a second layer provided on the first layer and including copper;
    forming a plug on the interconnect such that the plug includes (a) a third layer including titanium and nitrogen, and (b) a fourth layer provided on the third layer and including tungsten;
    nitriding an upper end of the third layer by an NH$_3$ heat treatment or an NH$_3$ plasma treatment wherein N represents nitrogen, and H represents hydrogen,
    wherein the forming of the third layer includes supplying a first gas including titanium and chlorine, and supplying a second gas including nitrogen and hydrogen after supplying the first gas,
    wherein the second gas includes NH$_3$ gas.

2. The method for manufacturing a semiconductor device according to claim 1, wherein the plug has a concentration of chlorine in the third layer is less than or equal to $5.0\times10^{21}$ atoms/cm$^3$, and a concentration of oxygen at the interface between the third layer and the fourth layer is less than or equal to $5.0\times10^{21}$ atoms/cm$^3$.

3. The method for manufacturing a semiconductor device according to claim 1, wherein the first gas includes TiCl$_4$ gas where Ti represents titanium, and Cl represents chlorine.

4. The method for manufacturing a semiconductor device according to claim 1, wherein forming the third layer includes alternately repeating supplying the first gas under plasma conditions, and supplying the second gas under plasma conditions.

5. The method for manufacturing a semiconductor device according to claim 1, wherein the forming the third layer is carried out at a temperature of greater than or equal to 300° C. and less than or equal to 430° C.

6. The method for manufacturing a semiconductor device according to claim 1, further comprising:
   after supplying the first gas, forming a titanium film containing chlorine by a first plasma treatment.

7. The method for manufacturing a semiconductor device according to claim 6, further comprising:
   performing a second plasma treatment using the second gas to remove chlorine from the titanium film and form the third layer.

8. The method for manufacturing a semiconductor device according to claim 1, wherein the first gas further includes $H_2$ (hydrogen) gas.

9. A method for manufacturing a semiconductor device, comprising:
   forming an interconnect trench,
   forming an interconnect including (i) a first layer provided on a side surface and a bottom surface of the interconnect trench, and (ii) a second layer provided on the first layer and facing a side surface and a bottom surface of the first layer, including copper; and
   forming a plug on the interconnect such that the plug includes (a) a third layer with a bottom facing the first layer and the second layer, the third layer including titanium and nitrogen, and (b) a fourth layer provided on the third layer and including tungsten,
   wherein the forming of the third layer includes supplying a first gas including titanium and chlorine, and supplying a second gas including nitrogen and hydrogen after supplying the first gas,
   wherein forming the third layer includes (1) alternately repeating supplying the first gas under plasma conditions, and supplying the second gas under plasma conditions and (2) nitriding an upper end of the first layer facing the third layer and a vicinity of the upper end.

10. The method for manufacturing a semiconductor device according to claim 9, wherein the plug has a concentration of chlorine in the third layer is less than or equal to $5.0 \times 10^{21}$ atoms/cm$^3$, and a concentration of oxygen at the interface between the third layer and the fourth layer is less than or equal to $5.0 \times 10^{21}$ atoms/cm$^3$.

11. The method for manufacturing a semiconductor device according to claim 9, wherein the first gas includes $TiCl_4$ gas where Ti represents titanium, and Cl represents chlorine.

12. The method for manufacturing a semiconductor device according to claim 9, wherein the second gas includes $NH_3$ gas wherein N represents nitrogen, and H represents hydrogen.

13. The method for manufacturing a semiconductor device according to claim 12, further comprising:
   nitriding an upper end of the third layer by an $NH_3$ heat treatment or an $NH_3$ plasma treatment.

14. The method for manufacturing a semiconductor device according to claim 9, wherein the forming the third layer is carried out at a temperature of greater than or equal to 300° C. and less than or equal to 430° C.

15. The method for manufacturing a semiconductor device according to claim 9, further comprising:
   after supplying the first gas, forming a titanium film containing chlorine by a first plasma treatment.

16. The method for manufacturing a semiconductor device according to claim 15, further comprising:
   performing a second plasma treatment using the second gas to remove chlorine from the titanium film and form the third layer.

17. The method for manufacturing a semiconductor device according to claim 9, wherein the first gas further includes $H_2$ (hydrogen) gas.

* * * * *